United States Patent

Rohlfing et al.

[11] Patent Number: 5,818,097
[45] Date of Patent: Oct. 6, 1998

[54] TEMPERATURE CONTROLLING CRYOGENIC PACKAGE SYSTEM

[75] Inventors: Stephan M. Rohlfing, Newbury Park; Roger J. Forse, Santa Barbara; Michael J. Scharen, Santa Barbara; Wallace Kunimoto, Santa Barbara, all of Calif.

[73] Assignee: Superconductor Technologies, Inc., Santa Barbara, Calif.

[21] Appl. No.: 369,004

[22] Filed: Jan. 5, 1995

[51] Int. Cl.⁶ ............... F25B 29/00; H01L 23/56; H01L 23/34; H01L 27/02
[52] U.S. Cl. ............... 257/468; 257/469; 257/716; 62/51.1; 219/209; 219/210; 165/263
[58] Field of Search ............... 165/263; 219/210, 219/209; 62/51.1; 257/716, 469, 468

[56] References Cited

U.S. PATENT DOCUMENTS

| | | |
|---|---|---|
| 3,393,870 | 7/1968 | Jeffrey ................................. 219/210 |
| 3,395,265 | 7/1968 | Weir ................................. 219/209 |
| 3,667,246 | 6/1972 | St. Laurent et al. . |
| 3,809,931 | 5/1974 | White et al. ................................. 219/210 |
| 3,887,785 | 6/1975 | Ahlport ................................. 219/209 |
| 4,118,947 | 10/1978 | Diedrich et al. ................................. 62/51.1 |
| 4,194,119 | 3/1980 | MacKenzie . |
| 4,306,425 | 12/1981 | Sitte et al. . |
| 4,369,636 | 1/1983 | Purcell et al. . |
| 4,546,614 | 10/1985 | Kline et al. ................................. 62/51.1 |
| 4,576,010 | 3/1986 | Windecker . |
| 4,692,560 | 9/1987 | Hotta et al. . |
| 4,712,607 | 12/1987 | Lindemans et al. . |
| 4,739,382 | 4/1988 | Blouke et al. ................................. 257/716 |
| 4,827,217 | 5/1989 | Paulson . |
| 4,848,093 | 7/1989 | Simmonds et al. . |
| 4,872,322 | 10/1989 | Woods et al. . |
| 4,876,413 | 10/1989 | Vermilyea . |
| 4,895,831 | 1/1990 | Laskaris . |
| 4,918,312 | 4/1990 | Wellman et al. . |
| 4,930,318 | 6/1990 | Brzozowski . |
| 4,950,901 | 8/1990 | Jones et al. . |
| 4,955,204 | 9/1990 | Pehl et al. ................................. 62/51.1 |
| 4,970,868 | 11/1990 | Grebe et al. . |
| 4,977,748 | 12/1990 | Diedrich ................................. 62/51.1 |
| 4,995,236 | 2/1991 | Rouguier et al. ................................. 62/51.1 |
| 5,101,638 | 4/1992 | White . |
| 5,150,578 | 9/1992 | Oota et al. . |
| 5,166,777 | 11/1992 | Kataoka . |
| 5,177,054 | 1/1993 | Lloyd et al. . |
| 5,193,349 | 3/1993 | Laverman et al. . |
| 5,196,395 | 3/1993 | James et al. ................................. 505/1 |
| 5,212,626 | 5/1993 | Bell et al. . |
| 5,248,662 | 9/1993 | Yoshida et al. . |
| 5,260,266 | 11/1993 | Herd et al. . |
| 5,260,575 | 11/1993 | Iwasaki et al. ................................. 62/51.1 |
| 5,309,090 | 5/1994 | Lipp ................................. 219/209 |
| 5,323,293 | 6/1994 | Angiulli et al. ................................. 257/716 |
| 5,328,893 | 7/1994 | Sun et al. ................................. 505/210 |
| 5,424,510 | 6/1995 | Gusinov et al. ................................. 219/209 |

OTHER PUBLICATIONS

Paghdar et al. "Low-Cost controller stabilizes heater type cryostats" *Electronics* vol. 54 No. 17 Aug. 25, 1981 p. 133.
Dobkin, Robert On-Chip Heater helps to stabilize monolithic reference zener Electronics Sep. 16, 1976 vol. 49, No. 19 pp. 106-112.

*Primary Examiner*—John K. Ford
*Attorney, Agent, or Firm*—Lyon & Lyon LLP

[57] ABSTRACT

A temperature controlled cryogenic package system for efficiently and precisely monitoring and controlling the operating temperature of a high temperature superconductor circuit placed on a substrate. The cryogenic package system comprises a heating element formed on the same substrate as the high temperature superconductor circuit, a control circuit capable of activating and deactivating the heating element, and a temperature sensor placed in thermal proximity to the high temperature superconductor circuit. The temperature sensor monitors the operating temperature of the high temperature superconductor circuit, and conveys temperature information to the control circuit. The control circuit activates or deactivates the heating element according to the warming or cooling effect that is necessary in order to maintain the high temperature superconductor circuit within a predetermined temperature range, where the range of temperature fluctuation is within plus or minus 0.1 K of a predetermined temperature.

1 Claim, 2 Drawing Sheets

TEMPERATURE CONTROLLING CRYOGENIC PACKAGE SYSTEM

FIELD OF THE INVENTION

This invention relates to a cryogenic package system, and more specifically to a cryogenic package system for maintaining a high temperature superconductor circuit within a predetermined temperature range.

BACKGROUND OF THE INVENTION

The concept of maintaining a cryogenic environment within a predetermined temperature range through the use of a heating or cooling element is known in the art. In U.S. Pat. No. 3,667,246, a cryogenic load is maintained at a predetermined temperature range by regulating the temperature of a coolant. In U.S. Pat. No. 4,306,425, a biological object is maintained at a predetermined temperature range by regulating the temperature of a metal receptacle. In U.S. Pat. No. 4,712,607, biological material is maintained at a predetermined temperature range by regulating the temperature of a space for receiving such materials. In U.S. Pat. No. 4,848,093, the temperature in a cryogenic test chamber is maintained at a predetermined temperature range by regulating the temperature of a fluid supplied to the test chamber by a capillary tube. In U.S. Pat. No. 5,101,638, a magnetic field generator is maintained at a predetermined temperature range by regulating the temperature of a thermal shield surrounding the generator.

As disclosed by the prior art mentioned above, objects are typically maintained within a predetermined temperature range by using a heating or cooling element to regulate the temperature of the cryogenic environment or materials surrounding the object. While this approach is sufficient for maintaining the object within a relatively wide temperature range, there are certain applications that cannot tolerate such a wide temperature range, because these certain applications depend on high performance circuits that are very temperature sensitive.

An example of such a high performance circuit is a high temperature superconductor circuit. These high temperature superconductor circuits are very temperature sensitive, although they do exhibit desirable properties when cooled to cryogenic temperatures. The term "high temperature" is used as a relative term, and generally refers to temperatures above 30 Kelvin (K), and more particularly, refers to temperatures above the boiling point of liquid nitrogen, which is approximately 77 K. To put Kelvins into a proper frame of reference, 77 K is approximately 320° Fahrenheit (F). Thus, even these so called "high temperature" superconductor circuits operate at extremely cold temperatures that require highly specialized equipment and control techniques for optimum performance.

Cryogenic operating temperatures are typically achieved by using cryogenic coolants stored in dewars to cool the environment surrounding the object. For high temperature superconductor circuits, the use of liquid nitrogen as a cryogenic coolant provides an acceptable operating temperature of approximately 77 K, or –320° F.

One highly advantageous benefit of high temperature superconductor circuits is their low resistance. This property results in extremely selective and precise frequency responses in resonant circuits. A result of this beneficial feature is that very narrow frequency bandpass, or bandstop, filters can be formed from high temperature superconductor materials. In application, bandpass filters are desirable because they provide more channels in a narrow frequency spectrum, and bandstop filters are desirable because they reject interfering signals in a narrow frequency spectrum. High temperature superconductor technology is used in various types of circuits from narrow band filters to systems such as down converters.

Along with the benefits of high temperature superconductor circuits, there are also drawbacks. For example, minor variations, fluctuations, or deviations in the operating temperature have a direct impact on the performance of high temperature superconductor circuits.

The reason that high temperature superconductor circuits are highly sensitive to temperature fluctuations is due in part to the temperature dependence of the critical current density, which defines the maximum current density that can be carried before the superconductor material becomes resistive. Another factor is the temperature dependence of the magnetic penetration depth.

The frequency response of high temperature superconductor circuits are sensitive to temperature fluctuations far below their transition temperature. Furthermore, high temperature superconductor circuits are especially sensitive to fluctuations in their operating temperature when they are operating near their transition temperature, which is the temperature at which a high temperature superconductor circuit switches between a state of normal resistivity and a state of superconductivity.

Moreover, minor fluctuations in the operating temperature can shift the operating frequencies of certain high temperature superconductor circuits, such as filters and resonators, by several megahertz (MHz), adversely affecting the performance of such high temperature superconductor circuits.

Thus, it is desirable to operate circuits implementing high temperature superconductor materials within a predetermined temperature range, wherein the range of tolerance is plus or minus 0.1 K, a range that is currently very difficult to maintain using prior art cryogenic temperature control systems that control the temperature of the cryogenic environment or materials surrounding the circuit. With many of the prior art cryogenic temperature control systems, the relatively wide temperature range that is precisely maintainable is intolerably high for the proper operation of high temperature superconductor circuits in certain high performance applications.

Therefore, a better solution is needed for providing a system and method for maintaining the object within a predetermined temperature range in a cryogenic environment, wherein the range of temperature fluctuations is preferably less than ±0.1 K, thereby allowing certain high performance temperature sensitive circuits to perform within operational specifications.

SUMMARY OF THE INVENTION

The cryogenic package system of the present invention provides a novel configuration for maintaining an object, such as a high temperature superconductor circuit, within a narrow predetermined temperature range. The cryogenic package system of the present invention integrates a high temperature superconductor circuit and a heating element directly onto a common substrate, and then controls the heating element by monitoring the operating temperature of the high temperature superconductor circuit itself, rather than by merely monitoring the temperature of the cryogenic environment or materials surrounding the high temperature superconductor circuit. By regulating the operating temperature of the circuit itself, the cryogenic temperature control system has an improved ability to control the temperature fluctuations of the circuit with greater precision and with much shorter time constants.

In a preferred embodiment, the cryogenic package system of the present invention comprises a control circuit, a temperature sensor, and the heating element interacting in a closed loop temperature control system. The temperature sensor monitors the operating temperature of the high temperature superconductor circuit, and transmits this measured temperature reading to the control circuit. Depending upon whether the operating temperature of the circuit needs to be raised or lowered, the control circuit activates or deactivates the heating element accordingly. This in turn causes the operating temperature of the circuit to be modified, thereby causing the temperature sensor to send updated temperature readings to the control circuit. This feedback control process maintains the operating temperature of the circuit within an acceptable range of approximately plus or minus 0.1 K of a predetermined operating temperature.

By placing the high temperature superconductor circuit and the heating element on a common substrate, the heating element transfers its heat more efficiently to the circuit. If the heating element is located far from the circuit, then the heating element has to compete with and partially overcome the cooling effect of a cold head in order to sufficiently heat the cryogenic environment surrounding the circuit in an effort to raise the operating temperature of the circuit. As a result, the typical approach of heating the surrounding cryogenic environment of the object is less efficient than the cryogenic package system of the present invention which is designed to heat the object more directly. This is especially important when the cold head has a limited cooling capacity.

The predetermined operating temperature of the circuit is preferably slightly higher than the temperature of the cold head. In this way, the heating element, being in communication with the control circuit, can offset the cooling effect of the cold head if the operating temperature is too low, and can turn off the heating element to let the cold head cool the circuit if the operating temperature is too high.

By integrating the high temperature superconductor circuit and heating element onto a common substrate, and by placing the control circuit and temperature sensor in thermal proximity to the high temperature superconductor circuit, thermal paths and thermal time constants are reduced significantly, thereby increasing heater response time while decreasing heat input to the cold head which reduces efficiency. Moreover, the cool down time of the cryogenic package system is also reduced as a result of the reduced thermal mass of the substrate containing the high temperature superconductor circuit and heating element. This allows for an improved coarse temperature control of the high temperature superconductor circuit, since there is less thermal mass that the cold head needs to cool.

In addition, by placing the control circuit on the same substrate as the high temperature superconductor circuit and heating element, instead of outside the cryogenic package system, the cryogenic package system of the present invention minimizes the number of connections required between the cryogenic environment and an ambient, or room temperature (or non-cryogenic), environment that surrounds the cryogenic environment. This reduces the conductive thermal heat load that is conducted from the ambient environment via control circuit connecting cables to the cold head. This is critical to systems with limited cooling capabilities.

In a preferred embodiment, the substrate is placed in a housing that is attached to a cold head via thermal isolators of various thickness, cross-sectional area, and thermal conductivity. The ability to vary the thickness, cross-sectional area, and thermal conductivity of the thermal isolators serves as a coarse method of adjusting the temperature gradient between the cold head and the high temperature superconductor circuit so as to minimize heat input from the heating element to the cold head, such that the heating element heat is transferred more efficiently to the circuit rather than the cold head.

In a preferred embodiment of the cryogenic package system of the present invention, the heating element is formed from a thin film resistor material. The resistor material comprises nichrome, tantalum nitride, or other equivalent materials that function well in cryogenic environments. A patterned thin film heating element minimizes outgassing constraints, since no adhesives are used as in conventional die attach methods.

Various elements on the substrate, such as the control circuit or the high temperature superconductor circuit, are connected to the ambient environment by cables that are capable of transferring power and/or information. However, these cables conduct heat from the ambient environment to the cryogenic environment, thereby adding to the thermal load of the cryogenic package system. Therefore, in a preferred embodiment, a cable thermal strap is used to transfer heat conducted by the cable away from the high temperature circuit and to the cold head.

Accordingly, it is an object of the present invention to provide an improved cryogenic package system.

It is a further object of the present invention to provide a cryogenic package system for a high temperature superconductor circuit.

An additional object of the present invention is to provide a cryogenic package system for a high temperature superconductor circuit, whereby the temperature of the high temperature superconductor circuit is maintained within a predetermined temperature range by monitoring the temperature of the high temperature superconductor circuit itself.

Yet another object of the present invention is to provide a cryogenic package system for a high temperature superconductor circuit, whereby the temperature of the high temperature superconductor circuit is maintained at a predetermined temperature with a range of temperature fluctuations not to exceed ±0.1 K.

Further objects and advantages of the present invention will become apparent from a consideration of the drawings and ensuing description.

DETAILED DESCRIPTION OF A PREFERRED EMBODIMENT

Figure 1:
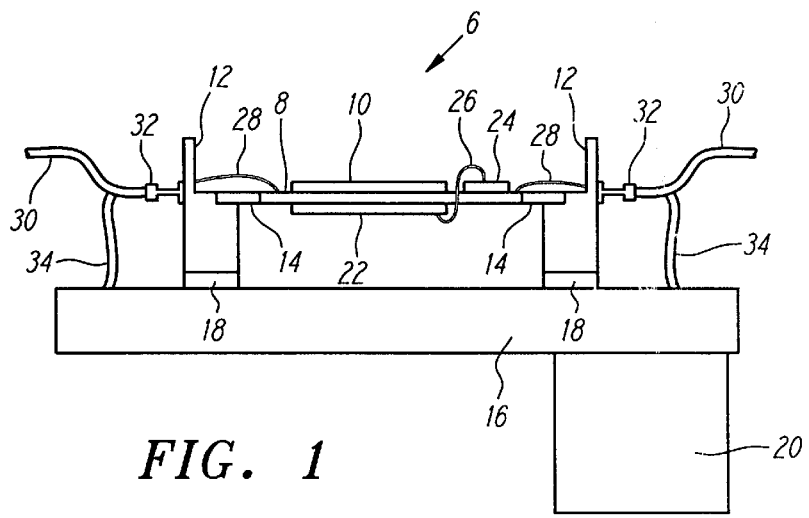
FIG. 1 is an elevational cutaway view of a preferred embodiment of a cryogenic package system for a high temperature superconductor circuit.

FIG. 1 shows a preferred embodiment of a temperature controlled cryogenic package system 6 of the present invention. It is understood that, for illustrative purposes, the various elements are not shown in proportion. A substrate 8 for receiving a high temperature superconductor circuit 10 is placed within a circuit housing 12, with the high temperature superconductor circuit 10 being thermally isolated from the circuit housing 12 by a circuit thermal isolator 14.

The circuit housing 12 containing the high temperature superconductor circuit 10 is placed upon a cold head 16, also known as a cooling interface. The circuit housing 12 is thermally isolated from the cold head 16 by a housing thermal isolator 18. The cooling effect of the cold head 16 on the high temperature superconductor 10 can be controlled by varying the thickness, cross-sectional area, and/or thermal conductivity of the circuit thermal isolator 14 and/or the housing thermal isolator 18. In addition, heating the high temperature superconductor circuit 10 can be made more efficient by reducing the amount of heat that is inputted to the cold head 16 by directing the heat more specifically to the high temperature superconductor circuit 10.

Attached to the cold head 16 is a cooler cold finger 20, which in a preferred embodiment comprises a liquid nitrogen reservoir, or another type of cooler, such as a Stirling cycle cooler (not shown). The use of a cold finger to cool a cold head is well known in the art, and is not discussed in further detail herein.

In a preferred embodiment, a heating element 22 is placed on the same substrate 8 as the high temperature superconductor circuit 10. A control circuit 24 is placed on this substrate 8 adjacent to the high temperature superconductor circuit 10, and the control circuit 24 is capable of being in electrical communication with the heating element 22 via a first electrical connection 26. Although the control circuit 24 can be placed on another substrate in an ambient environment separate from the high temperature superconductor circuit 10, by placing the control circuit 24 on the same substrate 8 as the high temperature superconductor circuit 10 fewer connections between the cryogenic environment and the ambient environment are required (and thus fewer discontinuities in environmental temperature exist), thereby reducing the conduction of heat from the ambient environment to the cryogenic environment. In a preferred embodiment, only power connections are required.

A bondwire 28 is used to electrically connect the high temperature superconductor circuit 10 to a cable 30 via a cable interface 32. The cable interface 32 provides a connection from the cable 30 to the high temperature superconductor circuit 10.

A cable thermal strap 34 is connected from the cable 30 to the cold head 16. The cable thermal strap 34 is used to transfer most of the heat conducted by the cable 30 from the ambient environment to the cold head 16, rather than letting the conducted heat dissipate into the cryogenic environment surrounding the high temperature superconductor circuit 10, which would affect the stability of the desired operating temperature of the high temperature superconductor circuit 10.

Figure 2:
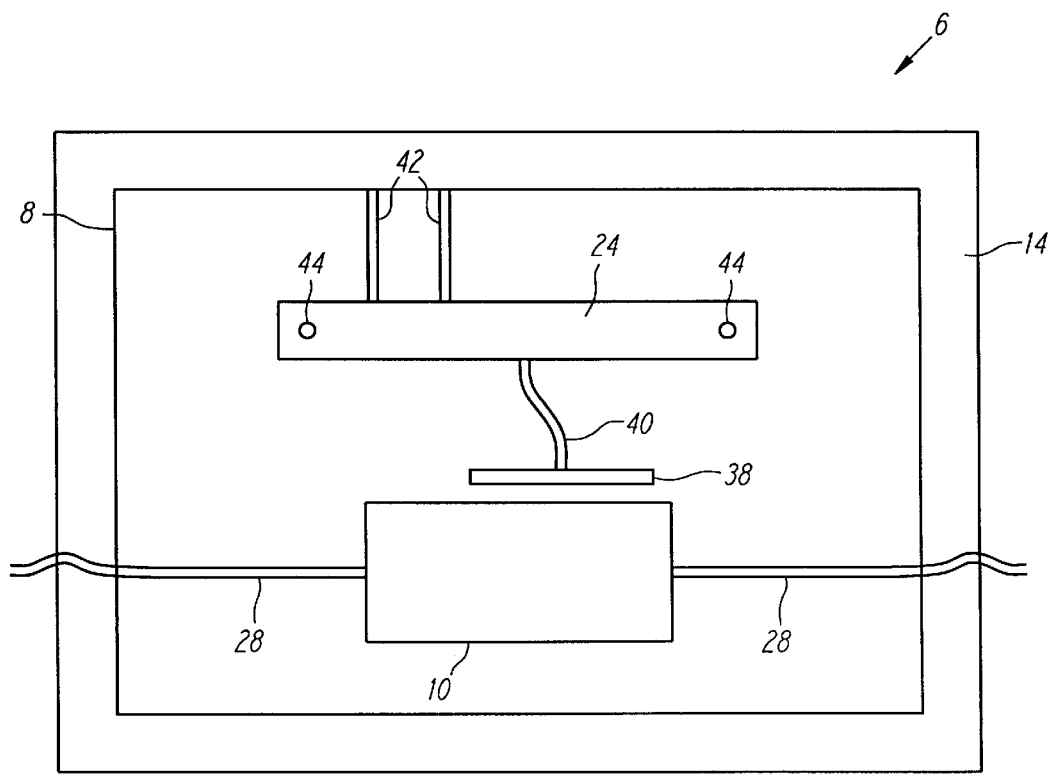
FIG. 2 is a top view of the cryogenic package system showing the high temperature superconductor circuit and temperature control elements in block form.

FIG. 2 is a top view of the cryogenic package system 6 showing the high temperature superconductor circuit 10 and temperature control elements comprising the heating element 22 (as shown in FIG. 1), the control circuit 24, and a temperature sensor 38. The high temperature superconductor circuit 10 is connected to the cable interface 32 (as shown in FIG. 1) via the bondwire 28. The temperature sensor 38 is placed in thermal proximity with the high temperature superconductor circuit 10, and the temperature sensor 38 is capable of being electrically connected to the control circuit 24 via a second electrical connection 40. The control circuit 24 comprises a third electrical connection 42 for allowing power and/or information to be transferred between the control circuit 24 in the cryogenic environment and various components in the ambient environment. For example, a bias signal from an ambient environment component to the control circuit 24 in the cryogenic environment can be transferred via the third electrical connection 42.

The substrate 8 has at least one via hole 44, shown through the control circuit 24 in FIG. 2, that allows for the first electrical connection 26 (as shown in FIG. 1) to be connected from the control circuit 24 on a top portion of the substrate 8 to the heating element 22 (as shown in FIG. 1) located on a bottom portion of the substrate 8.

Figure 3:
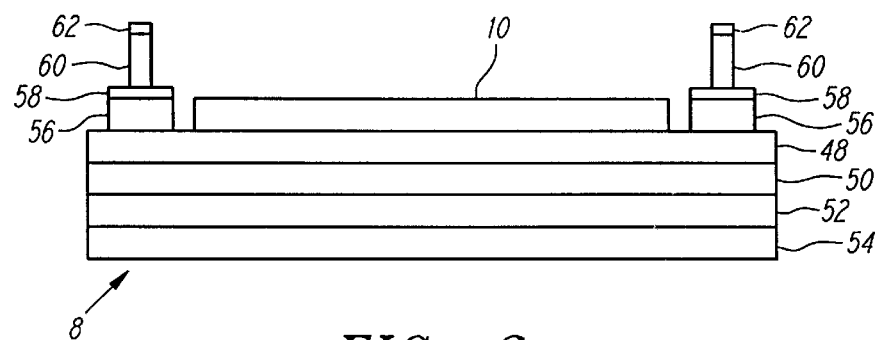
FIG. 3 is a side cutaway view of the cryogenic package system showing the various layers comprising a substrate.

In FIG. 3, a preferred embodiment of the substrate 8 is shown. It is understood that various elements, such as the control circuit 24 (as shown in FIG. 1), can be placed in the ambient environment separate from the substrate 8, but that in a preferred embodiment, placement of certain elements, such as the control circuit 24, on the substrate 8 provides certain benefits as discussed above. It is further understood that the various elements depicted in FIG. 3 are, for illustrative purposes, not shown in realistic proportion. For example, in FIG. 1, the heating element 22 appears to be an attachment to the substrate 8, whereas in FIG. 3, the heating element 22, described as a resistor material 52, appears to be integral to the substrate 8. In a preferred embodiment, the heating element 22, or resistor material 52, is integral to the substrate 8.

In a preferred embodiment of the substrate 8, a gold ground plane layer 48 is formed on a first ceramic layer 50, and the high temperature superconductor circuit 10 is formed on the gold ground plane layer 48. Formed on the other side of the first ceramic layer 50 is a layer of resistor material 52 that serves as the heating element 22. The resistor material 52 layer is coated with a passivation layer 54 to prevent shorting of the resistor material 52. Adjacent to the high temperature superconductor circuit 10 is a second ceramic layer 56 covered by a gold signal plane layer 58. A third ceramic layer 60 is covered by a layer of Ni/Au 62, and is formed on the gold signal plane 58 layer.

These layers provide protection and isolation for the high temperature superconductor circuit 10, as well as an interface path between the high temperature superconductor circuit 10 and elements outside of the cryogenic package system 6, in a manner well known in the art.

Constructing the substrate 8 from a material, such as alumina or magnesium oxide, with high thermal conductivity, high modulus of elasticity, high dielectric constant, and minimized mass provides the following benefits: (i) reduces cool down time, (ii) provides a good thermal path between the heating element 22 and the high temperature superconductor circuit 10, (iii) takes advantage of existing manufacturing technologies, (iv) is a lower-cost alternative to machined packages, (v) reduces the time constant, and (vi) provides a matched coefficient of thermal expansion between the high temperature superconductor circuit 10 and the cryogenic package system 6.

Figure 4:
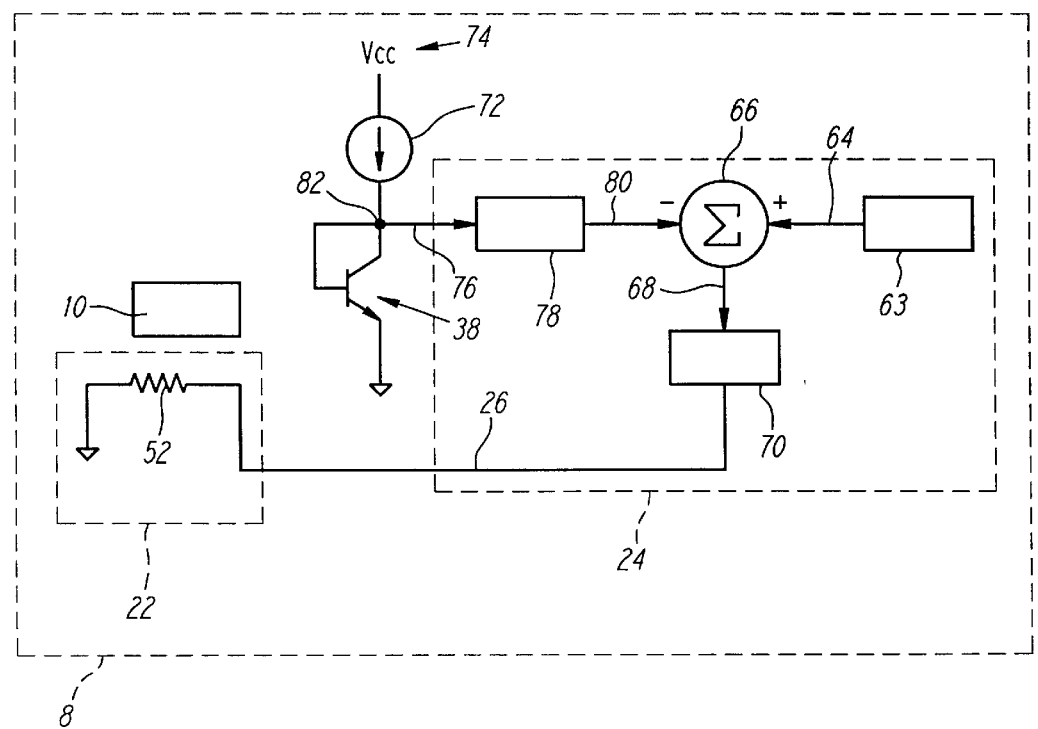
FIG. 4 is schematic representation of a closed loop temperature control system comprising the high temperature superconductor circuit, a heating element, a temperature sensor, and a comparator.

FIG. 4 is schematic representation of a closed loop temperature control system located on the substrate 8 comprising the high temperature superconductor circuit 10, the heating element 22, the temperature sensor 38, and the control circuit 24. The control circuit 24 comprises a comparator 66. A first voltage source 63 generates a stable reference voltage 64, or signal, corresponding to a predetermined temperature. The reference voltage 64 is provided as an input to a positive input of the comparator 66, and is either a fixed value or an adjustable value depending upon the application. The value of the reference voltage 64 may be adjusted to correspond to various different desired predetermined temperatures. The comparator 66 compares the reference voltage 64 with an amplified circuit temperature voltage 80 that is provided as an input to a negative input of the comparator 66, and then the comparator 66 outputs an error voltage 68 that represents the difference between the desired predetermined temperature and a sensed high temperature superconductor circuit 10 temperature. A positive or negative error voltage 68 is generated if the operating temperature of the high temperature superconductor circuit 10 deviates from the predetermined temperature, and approaches either the upper or lower range of the predetermined temperature range. The design and response time of the closed loop temperature control system is such that the temperature range will not deviate by more than plus or minus 0.1 K from the predetermined temperature.

If the error voltage 68 is positive, meaning that the temperature of the high temperature superconductor circuit 10 is lower than the desired predetermined temperature, the error voltage 68 is amplified by a first amplifier 70 in order to drive sufficient current through the resistor material 52, also referred to as the heating element 22. The current is transferred from the control circuit 24 to the heating element 22 via the first electrical connection 26, thereby causing the heating element 22 to generate heat. In other words, when the cold head 16 (as shown in FIG. 1) begins to cool the high temperature superconductor circuit 10 towards the lower range of the predetermined temperature range, the closed loop temperature control system responds accordingly by turning the heating element 22 on again. It is understood that, depending upon the magnitude of the positive error voltage 68, the amount of heat generated by the heating element 22 can be varied accordingly.

If the error voltage 68 is negative, meaning that the temperature of the high temperature superconductor circuit 10 is higher than the desired predetermined temperature, then the first amplifier 70 cuts off the current flow to the resistor material 52, thereby turning off the heating element 22 and allowing the high temperature superconductor circuit 10 to be cooled back down toward the predetermined temperature by the cold head 16 (as shown in FIG. 1).

Closed loop equilibrium is established when the amplified circuit temperature voltage 80 is equal to the reference voltage 64 such that the error voltage 68 output from the comparator 66 approaches zero. This means that the sensed temperature of the high temperature superconductor circuit 10 is equal to the predetermined temperature, and therefore, the current flow to the heating element 22 is cut off, thereby turning off the heating element 22. The total loop gain of the closed loop system is set to achieve a stable critically damped temperature control system.

In a preferred embodiment, the temperature sensor 38 comprises a silicon junction transistor, or diode, biased with a current source 72 that is powered by a second voltage source 74. Since the temperature sensor's 38 junction voltage 82 varies in a predictable manner with respect to the temperature of the object that the temperature sensor 38 is sensing, the temperature sensor 38 provides a changing circuit temperature voltage 76 that corresponds to changes in the sensed temperature of the high temperature superconductor circuit 10. The circuit temperature voltage 76 is amplified by a second amplifier 78, and the second amplifier 78 outputs the amplified circuit temperature voltage 80. The amplified circuit temperature voltage 80 is then, as discussed above, provided as an input to the negative input of the comparator 66.

While the above description contains many specifics, these should not be construed as limitations on the scope of the invention, but rather as examples of preferred embodiments thereof. Many other variations are possible. For example, the circuit thermal isolator 14 and the housing thermal isolator 18 can be combined to form a single integrated thermal isolator unit. In addition, the circuit housing 12 can be pivotally or removably extended over the top of the high temperature superconductor circuit 10 to act as a protective lid.

What is claimed is

1. A temperature controlled cryogenic package system comprising a substrate capable of receiving a high temperature superconductor circuit, a temperature sensor in thermal proximity to the high temperature superconductor circuit for sensing an operating temperature of the high temperature superconductor circuit, a heating element formed on said substrate for heating the high temperature superconductor circuit, a control circuit placed on said substrate capable of activating and deactivating said heating element in response to an input from said temperature sensor, thereby maintaining said operating temperature of the high temperature superconductor circuit within a temperature range having a maximum deviation of 0.1 K from a predetermined temperature, said substrate comprising at least one via hole through said substrate for electrically connecting said heating element with said control circuit, said control circuit comprising a comparator for comparing a temperature voltage from said temperature sensor and a reference voltage from a voltage source, wherein said temperature voltage reflects the operating temperature of the high temperature superconductor circuit, and said reference voltage reflects the predetermined temperature.

a circuit housing for receiving said substrate, a cold head cooled by a cold finger for cooling the high temperature superconductor circuit, a thermal isolator for thermally isolating the high temperature superconductor circuit from said cold head, said circuit housing being connected to said cold head via said thermal isolator, wherein using a predetermined thermal impedance for said thermal isolator allows for coarse temperature control of said operating temperature, a cable for transmitting information between the high temperature superconductor circuit and an ambient environment, and a cable thermal strap for transferring conducted ambient heat from said ambient environment to said cold head.

* * * * *